United States Patent [19]

Pelly

[11] Patent Number: 5,455,758
[45] Date of Patent: Oct. 3, 1995

[54] SELF-GENERATING RESONANT POWER SUPPLY AND METHOD OF PRODUCING POWER FOR TRANSISTOR SWITCHING CIRCUIT

[75] Inventor: Brian R. Pelly, Palos Verdes Estates, Calif.

[73] Assignee: International Rectifier Corporation, El Segundo, Calif.

[21] Appl. No.: 198,212

[22] Filed: Feb. 17, 1994

Related U.S. Application Data

[63] Continuation of Ser. No. 837,765, Feb. 18, 1992, abandoned.

[51] Int. Cl.⁶ ............................................. H02M 1/14
[52] U.S. Cl. ............................................. 363/47; 363/134
[58] Field of Search ............................. 363/47, 134, 56, 363/24, 26, 15, 49, 22, 40, 133; 323/901

[56] References Cited

U.S. PATENT DOCUMENTS

| | | | |
|---|---|---|---|
| 3,596,165 | 7/1971 | Andrews | 363/26 |
| 4,017,784 | 4/1977 | Simmons et al. | |
| 4,184,197 | 1/1980 | Cuk et al. | 363/16 |
| 4,336,587 | 6/1982 | Boettcher et al. | 363/134 |
| 4,462,071 | 7/1984 | Blok | 363/44 |
| 4,477,868 | 10/1984 | Steigerwald | |
| 4,593,346 | 6/1986 | Nooijen et al. | |
| 4,623,960 | 11/1986 | Eng | 363/21 |
| 4,685,041 | 8/1987 | Bowman | 363/40 |
| 4,692,851 | 9/1987 | Attwood | |
| 4,763,235 | 8/1988 | Morita | 363/19 |
| 4,857,822 | 8/1989 | Tabisz et al. | 323/282 |
| 4,862,344 | 8/1989 | Emoto | 363/147 |
| 5,036,450 | 7/1991 | Kelleher, Jr. et al. | 363/26 |

FOREIGN PATENT DOCUMENTS

| | | |
|---|---|---|
| 2662031 | 11/1991 | France. |
| 1050192 | 12/1966 | United Kingdom. |
| 1251748 | 10/1971 | United Kingdom. |
| 1576552 | 10/1980 | United Kingdom. |
| 0107770 | 9/1983 | United Kingdom. |
| 2138224 | 10/1984 | United Kingdom. |
| 2170663 | 8/1986 | United Kingdom. |
| 2199202 | 12/1986 | United Kingdom. |

*Primary Examiner*—Peter S. Wong
*Assistant Examiner*—Adolf Berhane
*Attorney, Agent, or Firm*—Ostrolenk, Faber, Gerb & Soffen

[57] ABSTRACT

A resonant power supply for use in conjunction with power transistor switching circuits. In one embodiment, a series-connected LC resonant circuit is coupled to the high voltage pulsed output of the power transistors and designed to draw power from the pulsed output and deliver the same to a low voltage output capacitor at which a low voltage output is provided. The low voltage output is regulated by a zener diode connected in parallel with the output capacitor. A starting resistor of a relatively high value, typically in the Megohm range, supplies initial charge to the output capacitor to permit the first switching event to occur so that the resonant power supply can begin to provide power. The resonant frequency of the LC circuit is significantly higher than the maximum switching frequency of the power transistors, enabling the resonating high frequency wave forms of the LC circuit to supply repeated charge bursts to the output capacitor.

53 Claims, 7 Drawing Sheets

SELF-GENERATING RESONANT POWER SUPPLY AND METHOD OF PRODUCING POWER FOR TRANSISTOR SWITCHING CIRCUIT

This is a Continuation of application Ser. No. 07/837,765 filed on Feb. 18, 1992 now abandoned.

BACKGROUND OF THE INVENTION

The present invention relates to switching circuits for power transistors and, more particularly, to an auxiliary resonant power supply for providing power to the transistors and other circuit elements in the switching circuit.

Figure 1:
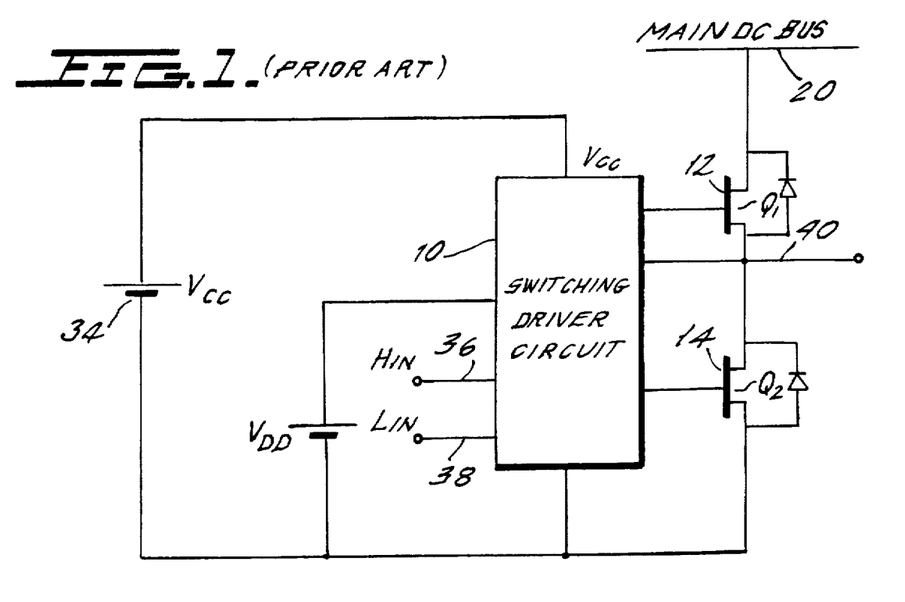
FIG. 1 is a block diagram illustrating the power supply requirements of a drive circuit which drives a pair of main power transistors.

FIG. 1 illustrates a conventional circuit in which a switching circuit 10, comprising, for example, an IR 2110 monolithic bridge driver (available from the International Rectifier Corporation, the assignee herein) drives first and second, series-connected power transistors 12 and 14, for example, power MOSFETS. As is well known, anti-parallel diodes are connected across each of transistors 12 and 14 and are denoted by X. For its own operation, the switching circuit 10 comprising a monolithic bridge driver requires a pair of low-voltage supplies $V_{DD}$ and $V_{CC}$, as shown. Low current logic circuitry in the monolithic bridge driver 10 is powered from $V_{DD}$ and does not consume much current. The circuitry connected to $V_{CC}$ draws the current needed to supply the gate charge of the MOSFETs or IGBTs represented by the driven power transistors 12 and 14. This current can be significant. For example, to drive IRF450 HEXFETs (transistors supplied by International Rectifier Corporation) at a frequency of 500 Khz requires a current $I_{CC}$:

$$\begin{aligned} I_{cc} &= 2Q_G f \\ &= 2 \cdot 120 \cdot 10^{-9} \cdot 500 \cdot 10^3 \cdot 10^3 mA \\ &= 120 \, mA \end{aligned}$$

There is a need for a simple efficient low cost power supply to furnish this current, at a typical voltage range of 12 to 18 volts.

Prior art methods of implementing the required auxiliary power supply are illustrated in FIGS. 2(a)–2(d). The circuit of FIG. 2(a) uses a "dropping" resistor 18 to drop the relatively high voltage at the main DC bus 20 to a lower voltage that is regulated by the zener 22 and delivered from the storage capacitor 24. This can be practical where the required current is not too high, as the dissipation in the resistor 18 will not be excessive. For example, two of the aforementioned IRF450 HEXFET transistors operating at 3 kHz would consume an average current of about 0.75 mA from $V_{CC}$. Allowing for operation over a range of DC bus voltage from 200 to 400 volts, the corresponding maximum dissipation in the dropping resistor 18 would be about 600 mW, which is quite practical. At 500 Khz, however, the corresponding maximum dissipation in the resistor 18 would be about 100 watts, which is unacceptable.

Figure 2A:
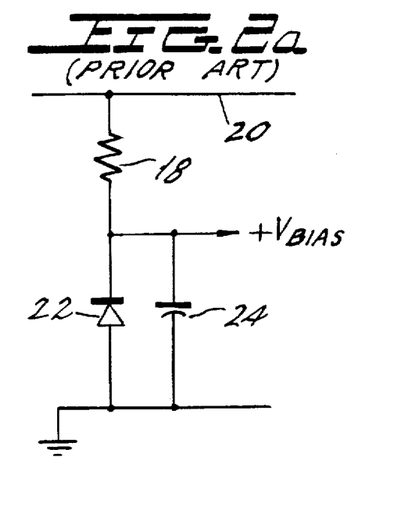
FIGS. 2(a)–2(d) illustrate prior art power supply arrangements for supplying power to the drive circuit of FIG. 1.
Figure 2B:
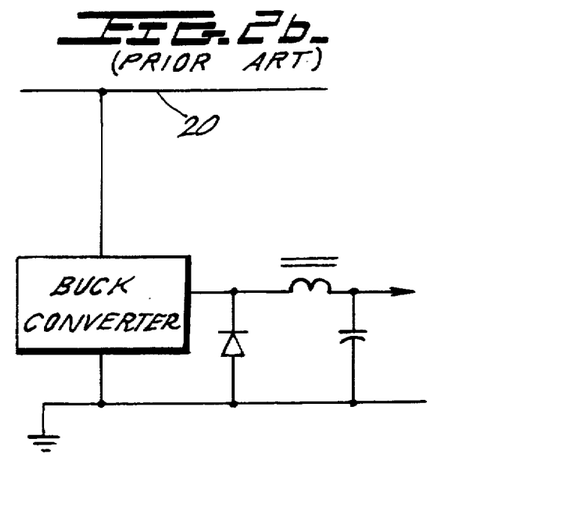

The prior art circuit in FIG. 2(b) uses a "buck" converter design. The "buck" converter design is efficient and provides a well-regulated power supply. By comparison with the to-be described circuit of the present invention, the buck converter may generally not be cost effective, though it does offer better performance, for example, at start-up.

Figure 2C:
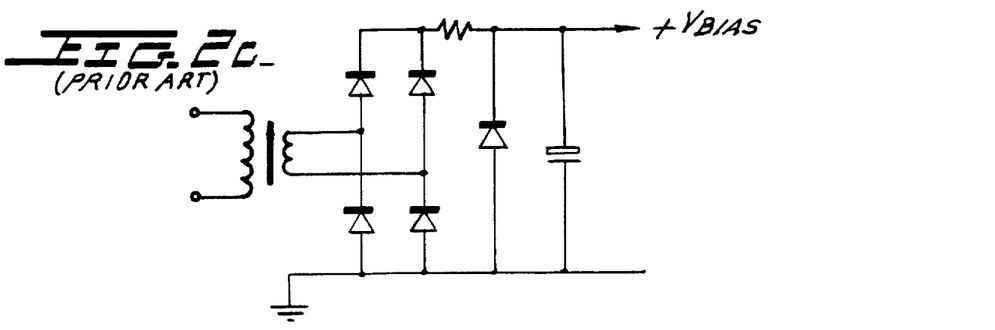
Figure 2D:
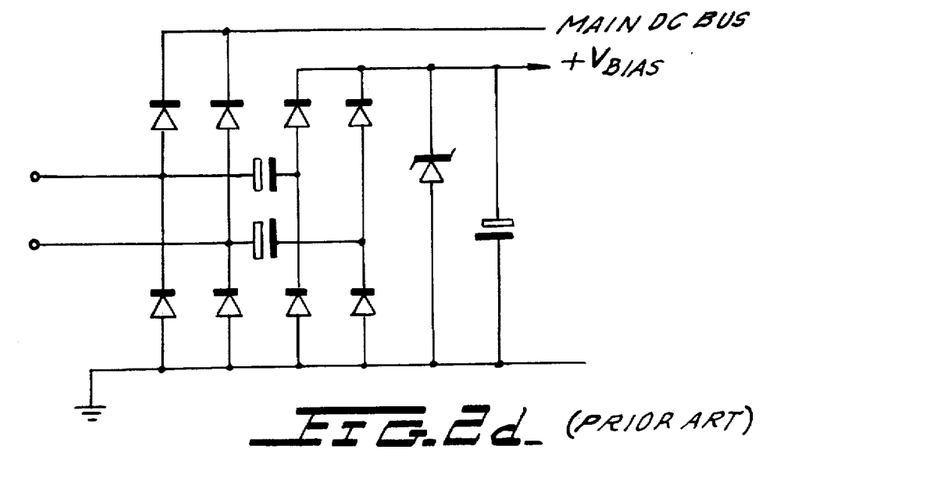

The bridge circuits of FIGS. 2(c) and 2(d) produce their auxiliary power from the AC line. Both circuits are viable only where AC line power is available, but even then, they require quite large and costly components.

In lieu of a buck converter, the present invention relies on the concept of employing a far simpler LC resonant circuit to charge an output low voltage storage capacitor.

Several patents relating to the switching power supply field describe series LC circuits. For example, U.S. Pat. No. 4,184,197 discloses a DC-to-DC converter using two inductances, one in series with the input source and the other in series with the output load. A capacitor is used with a switch (e.g. a transistor) between the inductances. The operation of the circuit, described at column 5, lines 20–37, of the patent, is significantly different from that of the present invention.

U.S. Pat. No. 4,654,769, discloses a DC-to-DC converter with a series LC circuit operating in conjunction with switching transistors $Q_1$ and $Q_2$ (see FIG. 2, in particular). However, the configuration/operation of the circuit (described at column 3, line 57 to column 4, line 14) is based upon the previously discussed patent, and differs significantly from the present invention.

U.S. Pat. No. 4,736,284 discloses a switching power circuit with an output delivered from a diode/capacitor configuration. A series LC resonant circuit, connected to supply charging current to an output capacitor is not disclosed.

SUMMARY OF THE INVENTION

Accordingly, it is a primary object of the present invention to provide an auxiliary power supply, and, in particular, for the drive circuit of main switching transistors.

It is furthermore an object to provide a power supply circuit for producing a low voltage DC output from a high voltage pulsed input.

It is yet still a further object to provide such a power supply which can be used in both "low side" and "high side" applications in a transistor switching circuit.

It is also an object of the present invention to provide a power supply circuit for a "low side" application including a series circuit that is connected in series between the pulsed load voltage output of a power transistor, at one end thereof, and to a charge storing capacitor from which the low voltage is supplied, at the other end.

It is another object to provide such a power supply circuit for a "high side" application including a series LC circuit that is connected in series between a DC supply voltage, at one end thereof, and to a charge storing capacitor from which the low voltage is supplied, at the other end, with the remaining terminal of the charge-storing capacitor being connected to the pulsed load voltage output of a power transistor.

It is a further object of the present invention to provide a circuit of the aforementioned type in which a comparatively low voltage and capacitance output capacitor may be used.

It is a further object of the present invention to provide an auxiliary power supply circuit which is simple and inexpensive to implement.

The above and other objects of the present invention are provided by a power supply circuit for producing a DC output from a pulsed input, comprising a series LC circuit having a first terminal coupled to the pulsed input and a second terminal; an output capacitor electrically charged from the series LC circuit and for providing the DC output; and a coupling circuit for coupling the charge from the series LC circuit to the output capacitor.

Preferably, a voltage regulator is coupled to the output capacitor to regulate and maintain the DC output at the output capacitor at a substantially constant predetermined value.

The foregoing and other objects of the invention are accordingly realized, in one embodiment in a system in which one or more drive-circuit controlling power output transistors provide a pulsed output, by a series LC circuit that is connected between the pulsed output and a low voltage output capacitor which provides low voltage power to the drive circuit of the power transistors.

In accordance with a salient feature of the present invention, the LC circuit is used to "steal" energy from the output of the main power switching transistor circuit each time a switching event takes place, and to store this energy for the next switching event.

A start-up circuit is employed to provide drive energy for the first switching event. By stealing the correct amount of energy at each switching event, the circuit automatically delivers the correct drive power, independent of frequency.

An LC circuit operating with the low voltage output capacitor comprises the heart of an auxiliary power supply from which power is supplied for running the drive circuit which controls the main power switching transistor or transistors. As noted, the auxiliary power supply is driven from an output of the main power switching transistor, which output provides a pulsed voltage. From this pulsed voltage, the auxiliary power supply develops the low voltages needed to drive the drive circuit.

More specifically, in its basic configuration, the present invention relates to a system which comprises a main DC bus, supplying a voltage in the range of 20 to 2,000 volts and higher, and typically, 200–400 volts, a pair of transistors for providing a high magnitude pulsed voltage output which is derived from the main DC bus, and a drive circuit for turning the pair of transistors on and off, typically mutually exclusively of one another and at a high frequency. The pulsed high voltage output is taken from a circuit terminal at which the two transistors are connected to one another.

The series-connected LC circuit has one node connected to the aforementioned circuit terminal and another node connected to the anode of a diode whose cathode supplies current to the output capacitor, which delivers a low voltage $V_{CC}$ output.

A second diode is connected in closed-circuit relationship with the series connection of the first-mentioned diode and the output capacitor and serves as a bypass diode for bypassing the "unwanted" negative half cycle of current from the output capacitor. A zener diode is connected in parallel across the output capacitor to regulate the low voltage output. A high impedance resistor, with a resistance value, for example, in the megohm range, comprising the start up circuit, is connected directly between the main DC bus and the output capacitor to permit the auxiliary power supply circuit to start. The $V_{CC}$ output represents and corresponds to the $V_{CC}$ voltage power source previously mentioned in connection with the description of the prior art.

A key aspect of the present invention is that it produces a power supply of high efficiency in a simple and inexpensive construction. The key to the high efficiency is the inductor which forms with the capacitor of the LC circuit a resonant circuit. Without the inductor, the capacitor would be no more efficient than the dropping resistor shown in FIG. 2(a). Indeed, without the resonating inductor, the capacitor takes just one "gulp" of current at each switching event. The charge associated with this "gulp" must be at least equal to the combined gate charges of the two output transistors. This charge is drawn from the "high" DC bus voltage, and delivered at a much lower output voltage, attaining a rather unacceptably low efficiency which is calculated as the ratio of the output voltage of the auxiliary power supply to the high voltage at the DC bus.

In contrast, with the resonant LC circuit, the output capacitor receives multiple current charges from each pulse of the output power, enabling use of a much smaller capacitor in the LC circuit and attaining a considerably higher efficiency, on the order of 89% or better as is described below.

Other features and advantages of the present invention will become apparent from the following description of the invention.

BRIEF DESCRIPTION OF THE DRAWINGS

The invention will now be described in greater detail in the following detailed description, with reference to the drawings, in which.

DETAILED DESCRIPTION OF THE DRAWINGS

Referring now to the drawings, it bears keeping in mind at the outset that the present invention specifically focuses on an auxiliary power supply 30 (FIG. 3) which develops a low voltage output 32, replacing the $V_{CC}$ power source 34 shown in prior art FIG. 1.

The auxiliary power supply 30 of the present invention has a wide range of applications but is specifically intended for use in conjunction with a system such as depicted in prior art FIG. 1 in which a switching/drive circuit 10 is employed for supplying gate/base current to a pair or pairs of power transistors 12 and 14. As in the prior art, anti-parallel connected diodes X are coupled across transistors 12 and 14. Such diodes X are present also in other embodiments to be described herein. The invention can be used for a one phase or three phase bridge circuit, in which all the $V_{CC}$ power is taken from just one phase.

Figure 4A:
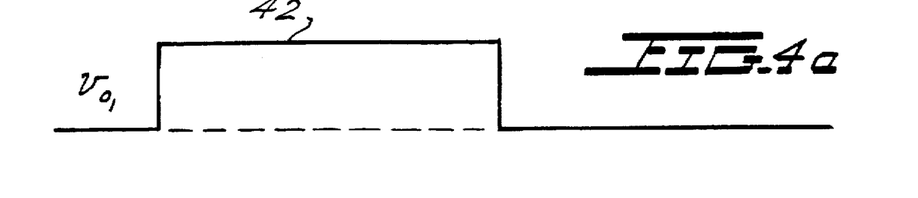
FIGS. 4(a)–(f) illustrate voltage and current waveforms for the circuit of FIG. 3.
Figure 4B:
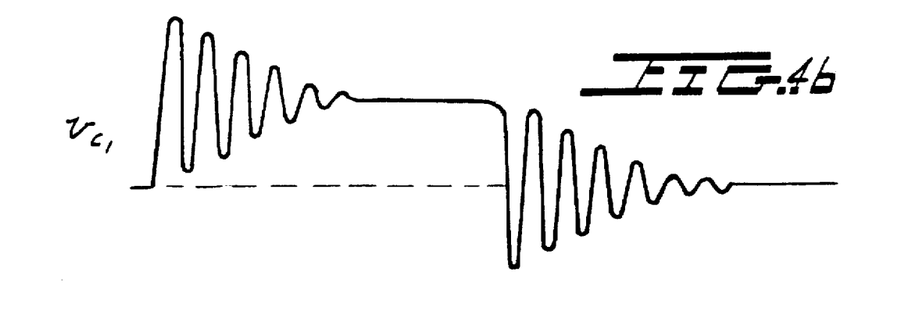
Figure 4C:
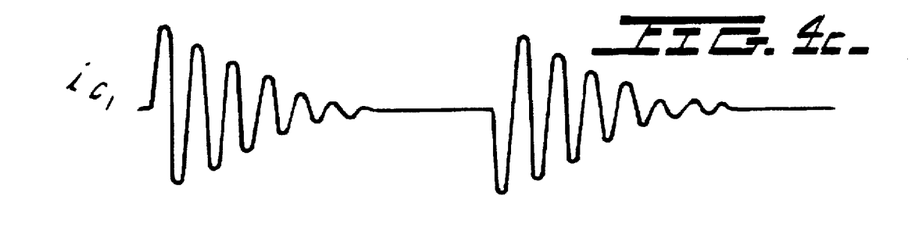
Figure 4D:
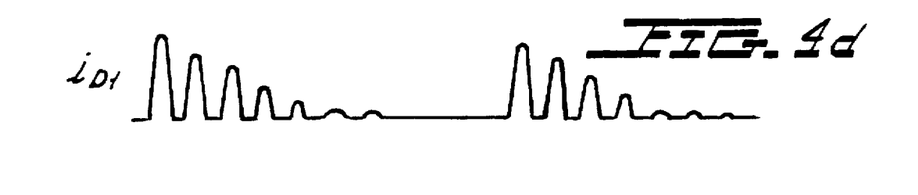
Figure 4E:
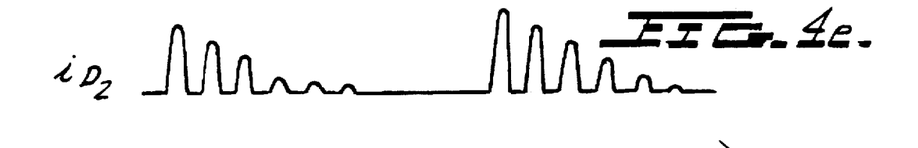
Figure 4F:
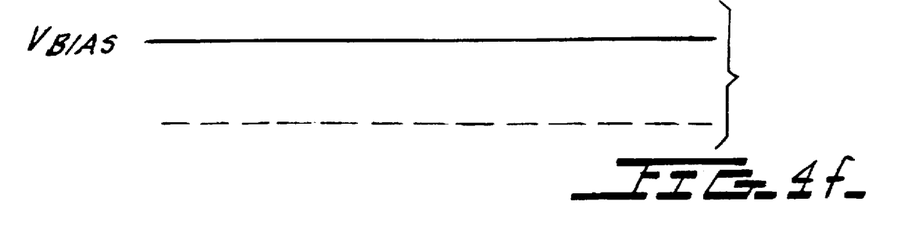

Typically, the switching/drive circuit responds to control signals at its input terminals 36 and 38 such as to develop at an output 40, a pulse output 42, shown in FIG. 4(a), and used to drive an electrical load (not shown). The pulsed output voltage 42 is developed by the drive circuit 10, alternatively, and mutually exclusively, turning on the power transistor 12 to deliver a positive voltage from the main DC bus 20 and the transistor 14 to connect the load to ground, on a mutually exclusive basis. The output 40 may be fed to the drive circuit 10 to regulate the output voltage.

Figure 3:
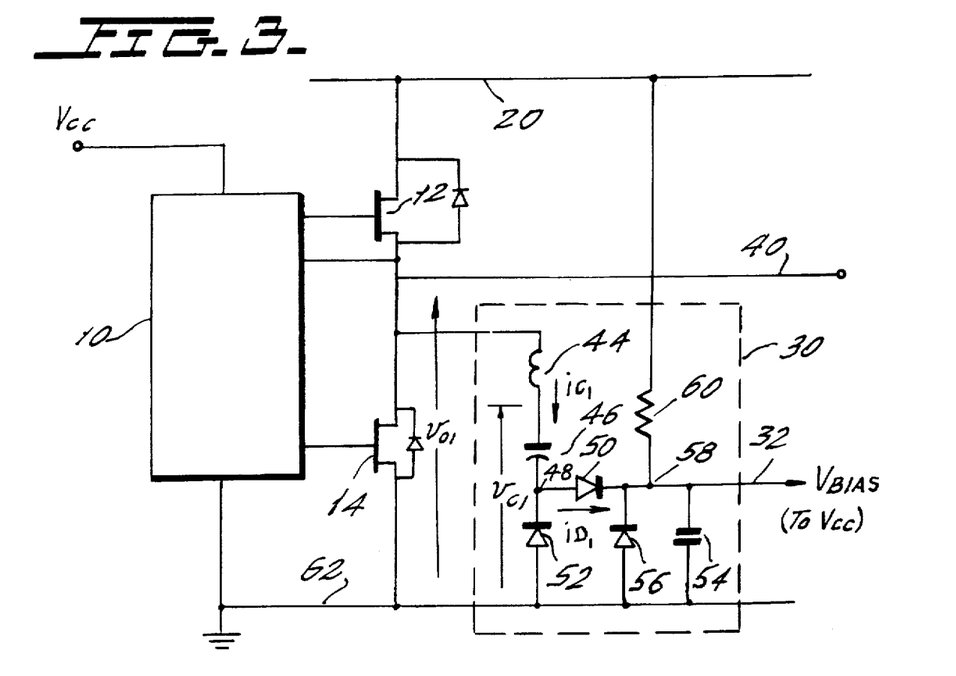
FIG. 3 is a basic circuit diagram of a resonant power supply constructed in accordance with the present invention.

As seen in FIG. 3, the output pulsed power voltage at terminal 40 is generated at the common terminal of the power transistors 12 an 14 and is tapped by the auxiliary power supply 30 to develop the low voltage output $V_{CC}$. Specifically, the inductor 44 of a series-connected LC circuit which also includes the capacitor 46 is connected to the common terminal with the other node 48 of the LC circuit connected to the cathode of a charging diode 50 and the anode of a bypass diode 52. A low voltage output capacitor 54 is charged from the anode of the diode 50 and has connected in parallel to it a voltage regulating zener diode 56. The common 10 terminal 58 of the capacitor 54, zener diode 56 and diode 50 is connected by a high value resistor 60 through the main DC bus 20. One terminal of each of the capacitor 54, the zener diode 56, the bypass diode 52 and the main power transistor 14 are returned to ground 62.

As noted at the outset, the low voltage $V_{CC}$ output 32 provides power to the driver circuit 10, as well as for other housekeeping purposes. The self-generating power supply according to the invention, once started, can provide this power source, so the $V_{CC}$ power source conventionally applied may no longer be necessary or can be supplemented by the resonant power supply according to the invention.

Operationally, the essence of the present invention lies in a simple and inexpensive LC circuit comprising the inductor 44 and capacitor 46 which "steal" energy from the pulsed load voltage output 40, each time a switching event takes place and stores this energy for the next switching event in the low voltage output capacitor 54. The resistor 60 comprises a pull-up circuit which charges the capacitor 54 from the bus 20 to provide drive energy for the first switching event. By stealing the correct amount of energy at each switching event, for the next one, the circuit automatically delivers the correct drive power, independent of frequency of the pulsed output 40. The resistor 60 has a relatively high value (typically 2 Megohm), and the power dissipation is low (typically about 100 mW).

As soon as the output transistors 12 and 14 start to be switched, a fixed "burst" of energy is transferred to the output, charging capacitor 54 via the series connected circuit comprising the inductor 44 and capacitor 46 which is designed to resonate in response to 10 each positive pulse from the output 40, with a resonant frequency which is significantly higher than the maximum switching frequency of the transistors 12 and 14, in order to have each resonant energy burst completed before the next output transistor switching event and avoid resonant energy build-up. A resonant frequency LC of several MHz will generally be appropriate.

Idealized wave forms of the auxiliary power supply 30 are shown in FIGS. 4(b)–(f). Positive half-cycles of current through capacitor 46 provide charge into the output capacitor 54 via the diode 50, while negative, half-cycles are shunted through the bypass diode 52. Each time the transistor 12 is switched ON, a net "burst" of energy equal to the capacitance $C_1$ of the capacitor 46 multiplied by the square of the voltage ($V_{DC}$) of the main bus 20 is delivered to the resonant circuit. At the end of each burst, half of this energy is stored in the capacitor 46 and the other half is divided between energy delivered to the output capacitor 54 and to its load and energy lost in the circuit itself. If the component values are chosen to steal just the needed amount of output energy, the efficiency will be relatively high (typically about 80%).

Depending on the manner of operation of the transistors 12 and 14 by the driver circuit 10, the capacitor 46 may or may not be charged to the voltage of the bus 20 when the second power transistor 14 is switched ON. If it is, a second burst of energy, equal to one-half $C_1 \cdot V_{DC}^2$ will be delivered from the capacitor 46 to the output circuit at this time.

The zener voltage of the zener diode 56 is selected to equal the desired value of $V_{CC}$, i.e., the low voltage output 32. If one-half $C_1 \cdot V_{DC}^2$ (less an allowance for component losses) is made equal to the energy $V_{CC} \cdot Q_G$ needed to switch on each of the transistors, then the zener diode will not absorb significant power.

Generally $V_{CC}$ will have to be regulated over a range of operating voltages of the main DC bus 20, and the energy being delivered must be satisfied at a minimal working DC bus voltage satisfying the relationship:

$$\tfrac{1}{2} C_1 V_{DCmin2} = 2Q_G \cdot V_{CC}.$$

At greater DC bus voltage, the excess energy delivered to the resonant circuit (44, 46) will be dissipated in the zener diode 56. At maximum DC bus voltage, $V_{DCmax}$, the energy lost in the zener diode 56 is:

$$\begin{aligned} E_{ZD} &= 2 \cdot 1/2 \, C_1 \, (V_{DCmax2} - V_{DCmin2}) \\ &= 2 \cdot 1/2 \, C_1 \, V_{DCmin2} \, (k^2 - 1) \\ &= 2 \, Q_G \, V_{cc} \, (k^2 - 1) \end{aligned}$$

where $k = V_{DCmax}/V_{DCmin}$

Note that the factor of 2 is provided in the above starting equation because equal amounts of energy are consumed when the capacitor 46 charges and when it discharges.

The power loss in the zener diode 56, $P_{ZD}$ is:

$$\begin{aligned} P_{ZD} &= 2 \, Q_G \, V_{cc} \, (k^2 - 1) f \\ &= 2 \, P_{cc} \, (k^2 - 1) \end{aligned}$$

where $P_{CC} = 2 \, Q_G \, V_{CC} \, f$ f = the operating frequency of the transistors 12 and 14.

In a situation where the driver circuit is an IR 2110 monolithic bridge driver and the transistors 12 and 14 are IRF450 hexfets (these parts being available from International Rectifier Corporation, the assignee herein), the transistors 12 and 14 operating at 400 kHz, a value $V_{CC}$ of 15 volts, and a working range of DC bus voltage from 200 volts to 400 volts, the losses in the zener diode 56 at maximum rail voltage are 5.4 watts, calculated using the aforementioned equation for $P_{ZD}$.

This calculation assumes that all the energy losses are focused in the zener diode. Actually, a portion of the lost power is dissipated in the inductor 44, capacitor 46 and diodes 50 and 52, as well as in the transistors 12 and 14. The actual dissipation in the zener diode 56 will therefore be less than the above-calculated value. Actual losses were measured to be about half the calculated values.

Accordingly, the present invention compares extremely favorably with the dropping resistor 18 implementation of prior art FIG. 2A, which would dissipate about 100 watts for the same operating conditions.

The key to the high efficiency of the resonating circuit (44, 46) is the inductor 44. With the capacitor 46 alone, the circuit would be no more efficient than the dropping resistor 18 of FIG. 2A. Moreover, as will be shown below, the inductor 44 enables the capacitor 46 to have a capacitance an order of magnitude smaller.

The explanation is that the capacitor 46, without the inductor 44, takes just one "gulp" of current at each switching event. The charge associated with this "gulp" must be at least equal to the combined gate charges of the two power transistors 12 and 14. This charge is drawn from the high DC voltage $V_{DC}$ at the bus 20, and delivered at a much lower voltage $V_{CC}$ at the output 32, for an efficiency (at $V_{DCmin}$) of $V_{CC}/V_{DCmin}$. The efficiency at $V_{DCmax}$ is further reduced by a factor of $1/k^2$, where $k=V_{DCmax}/V_{DCmin}$. The capacitor 46, operating alone with the aforementioned IRF450 transistors 12 and 14 at 500 Khz would produce losses of about 100 watts for a DC voltage at the bus 20 in the range of 200 volts to 400 volts.

Moreover, the value of the capacitor 46, operating without the inductor 44, would have to equal $2.Q_G/V_{DCmin}$ which would typically be an order of magnitude larger than the much smaller capacitor value needed with a resonant circuit (44, 46) with which the value $C_1$ of the capacitor 46 would be only equal to $2Q_G/V_{DCmin} \cdot V_{CC}/V_{DCmin}$.

The physical explanation for the high efficiency of the resonating circuit 44, 46 versus the poor efficiency of a non-resonating circuit is that, with the resonant circuit, the total charge delivered to the output circuit when the transistor 12 switches on is much higher than the charge drawn by the capacitor 46. That is because the output capacitor 54 receives multiple positive half-cycles of current during each resonant burst, and each of these contributes to the total output charge. The charge drawn by the capacitor 46, on the other hand, is the net integral of all the positive- and counter-acting negative half-cycles of current, and this is much smaller. The resonant circuit in effect acts as a charge multiplier.

The legends for the wave forms in FIGS. 4(b)–(f) correspond to the legends in FIG. 3, and FIGS. 4(b)–(f) assumes that the energy stored in the capacitor 46 will be released as a resonant burst to the capacitor 54 via the lower transistor 14, when the latter transistor is switched on. Such a mode of control is referred to as the "active pull-down" mode. If the transistor 14 is not actively switched on shortly after the transistor 12 switches off, only a "passive pull-down" occurs. In that event, the external load circuit determines how rapidly the capacitor 46 will be pulled down and some or all of the energy stored in the capacitor 46 may not be delivered to the output capacitor 54, but will be dissipated elsewhere. The slower the pull-down, the less energy will be transferred to the output capacitor 54.

At one extreme, zero energy transfer will take place during passive pull-down. In that event, capacitor 46 must deliver double the amount of energy to the capacitor 54 when the transistor 12 switches on, and must have double the value previously calculated. Note, however, that the energy lost from the capacitor 46 in the external circuit during passive pull-down does not increase the dissipation in the zener diode 56, because it is lost elsewhere.

Figure 5:
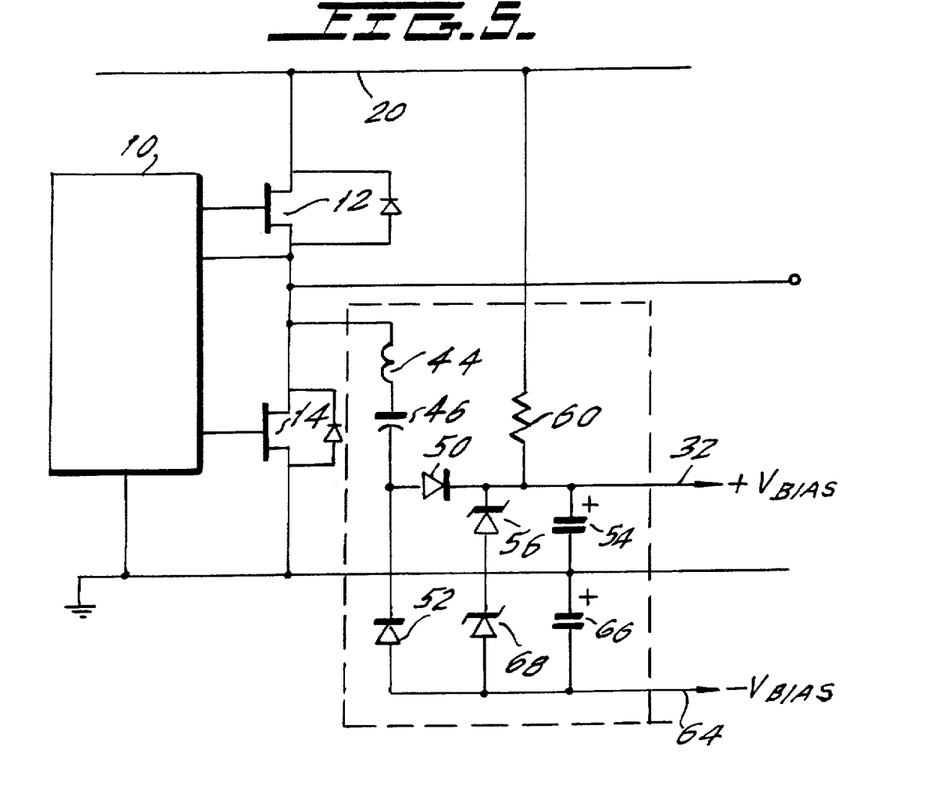
FIG. 5 is a diagram of the circuit of FIG. 3, further including a negative bias supply circuit.

Referring to FIG. 5, it is a simple matter to add a negative power supply to deliver a negative voltage ($-V_{CC}$) output 64. Only one additional output capacitor 66 and zener diode 68 are needed. A negative bias supply output will be useful, for example, where a current sensing transistor is used, and a negative power supply is needed for current sensing.

Figure 6:
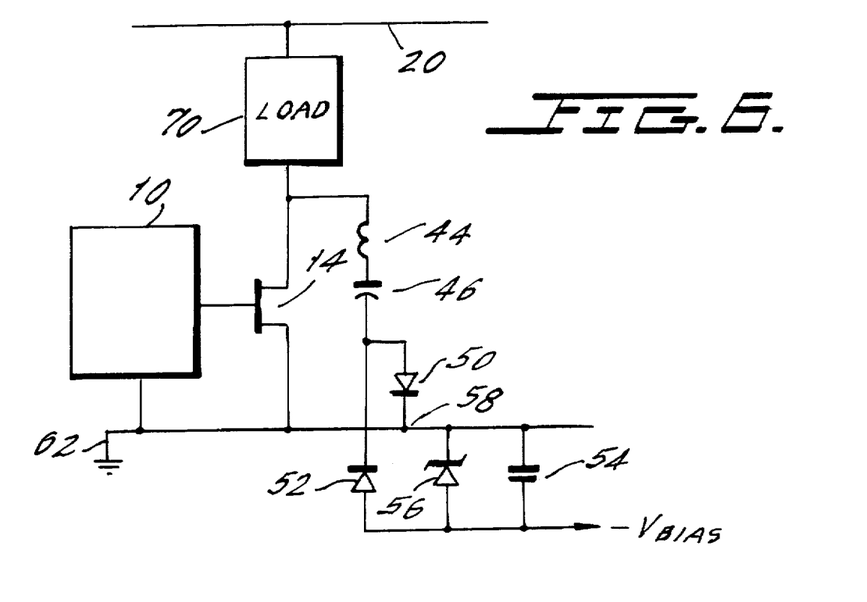
FIG. 6 is a circuit diagram of a further embodiment of the invention.

Referring to FIG. 6, a standalone negative power supply can be provided, with the elements of FIG. 3, by connecting the common terminal 58 to ground 62. This would be useful where a positive low voltage supply is already available, but a separate negative supply is needed, for example, for current sensing.

In the circuit shown in FIG. 3, it is assumed that a floating supply for the upper transistor 12 is obtained from the conventional $V_{CC}$ low voltage output 32 supply by means of a bootstrap diode-capacitor circuit (not shown) there.

In some applications, the voltage drop across the transistor 14, due to the load current, may seriously diminish the voltage to which the bootstrap capacitor charges during the conduction period of the transistor 14. In that event, the described resonating circuit 44, 46 can be used to provide a floating power supply for the upper transistor 12, independent of the voltage drop of the lower transistor 14.

Figure 7A:
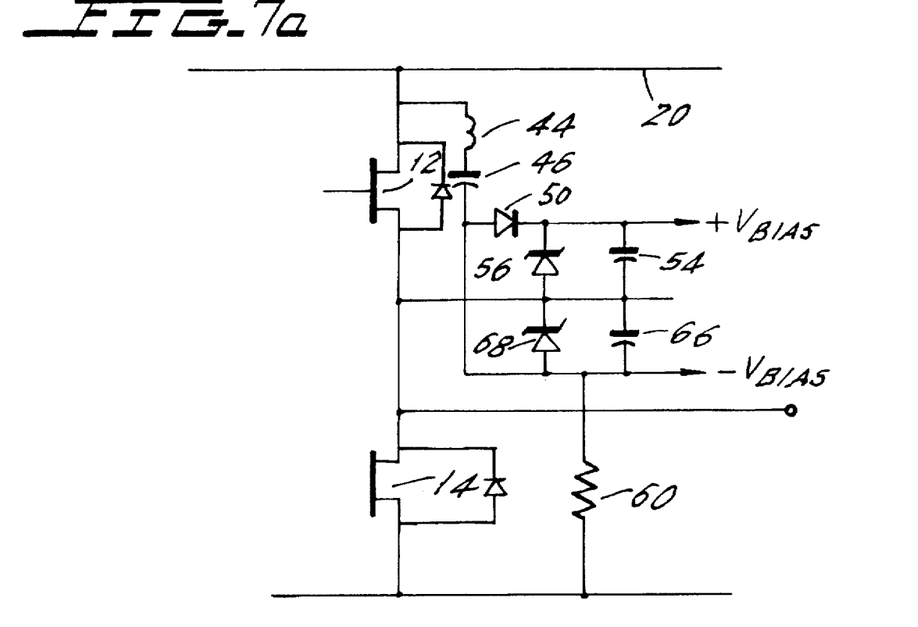
FIG. 7(a) is a circuit diagram of a still further embodiment of the present invention applied to the "high side" switch of a transistor switching arrangement and for producing positive and negative bias voltages.

FIG. 7(a) shows the floating positive or negative bias supplies for the upper transistor 12. Note that the start-up resistor 60 precharges both the positive and negative supplies. Note further that the resonating circuit 44, 46 is connected to the DC bus supply voltage 20.

Figure 7B:
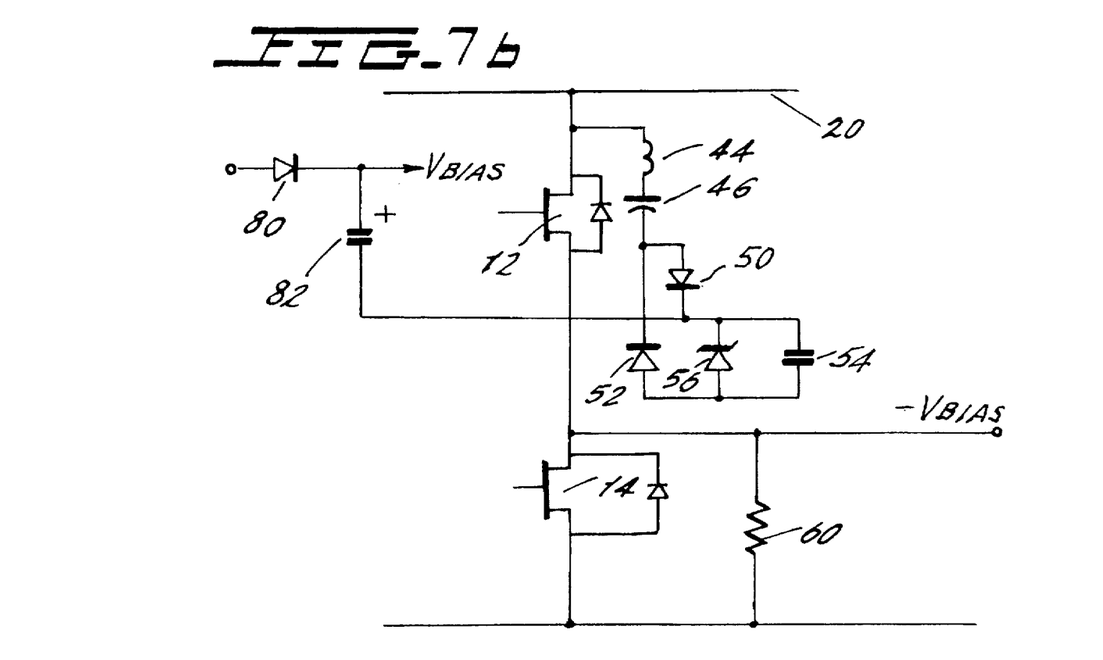
FIG. 7(b) is a circuit diagram of yet another embodiment of the present invention, also applied to the high side switch for providing a negative bias voltage, with a bootstrap circuit also being provided for providing a positive bias voltage.

FIG. 7(b) shows a floating negative supply for the upper transistor 12 that can be added to complement a bootstrap circuit, shown by the diode 80 and capacitor 82. Compare this circuit to the circuit shown in FIG. 6.

Figure 8:
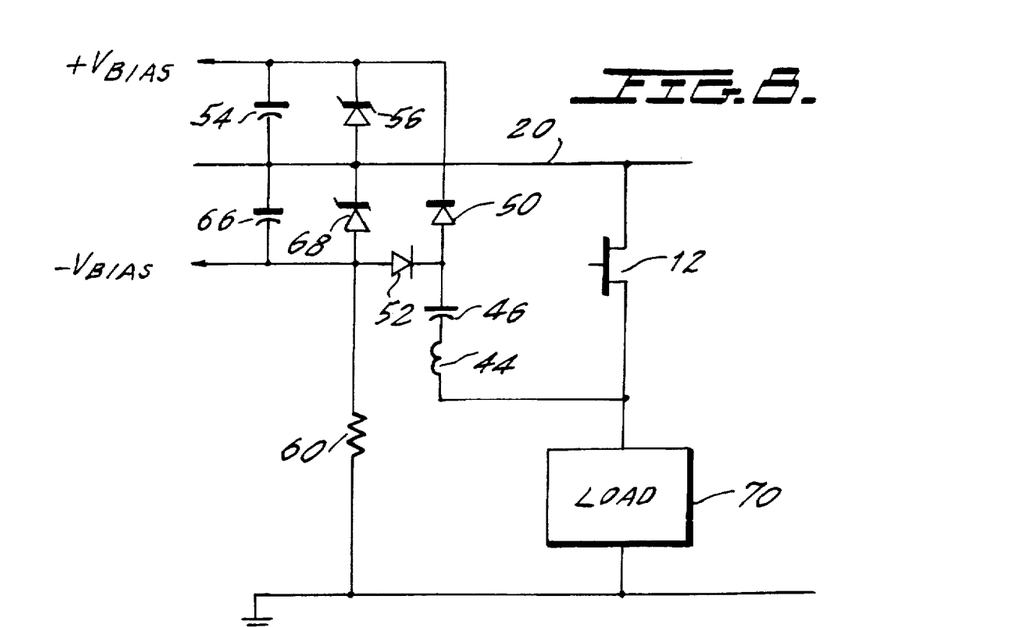
FIG. 8 is a schematic diagram of an auxiliary power supply which is effective for providing an over-rail and under-rail bias voltage referenced to a DC bus.

FIG. 8 illustrates a circuit connection for producing "over-rail" and "under-rail" supply voltages, the terms over-rail and under-rail referring to voltages which are respectively higher and lower than the voltage at the DC bus 20. Note that the under-rail circuit comprising the capacitor 66 and zener diode 68 is precharged by the start-up resistor 60, but the over-rail voltage supply including capacitor 54 and zener diode 56 establishes only once the output transistor 12 is running. The block 70 represents an electrical load.

Modules containing complete transistor power circuits are used extensively for applications such as motor speed controls and uninterrupted power supply (UPS) systems. Next generations of these modules will contain drive circuits and optoisolators.

A benefit of the present invention will be the inclusion of the power supply for the drive circuits inside the aforementioned modules. This will provide the user with a fully self-contained module that interfaces directly to CMOS or TTL logic without any additional interfacing components.

The efficiency and small size of the described resonating power supply, coupled with its property of automatically furnishing the correct amount of drive power, independent of the operating frequency, makes it ideal for inclusion within power MOSFET or IGBT power modules. A typical arrangement for an IGBT module is shown in FIG. 9.

Figure 9:
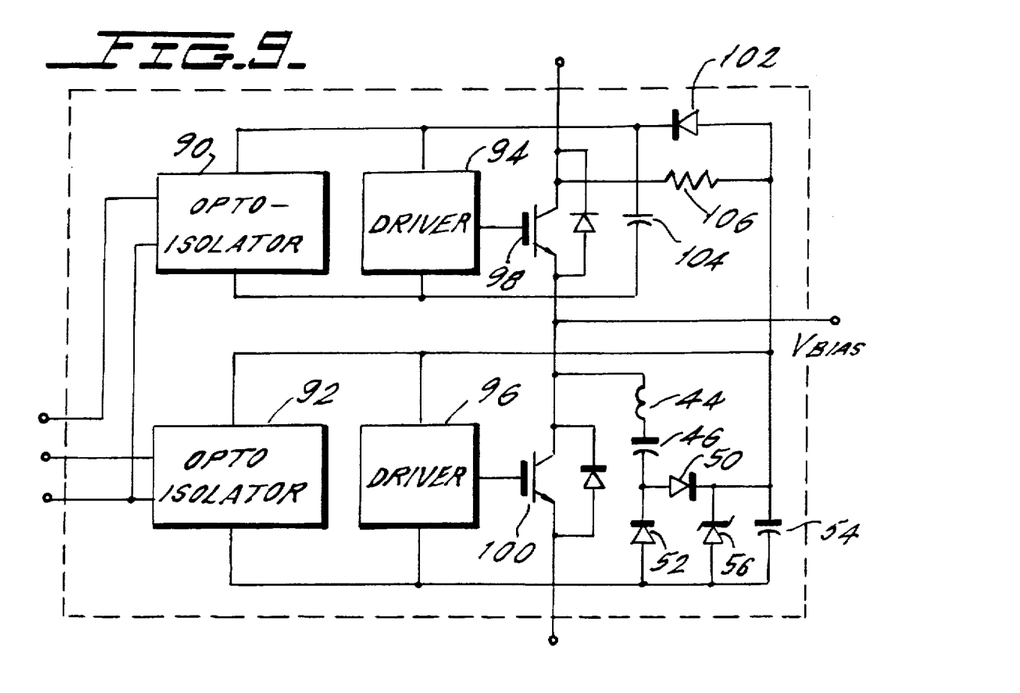
FIG. 9 is a block/circuit diagram of a self-contained IGBT module.

In the circuit of FIG. 9, input drive signals are provided to optoisolators 90 and 92, which drive respective drivers 94 and 96. Drivers 94 and 96 drive respective IGBTs 98 and 100. The self-generating power supply according to the present invention is shown coupled to IGBT 100, in the same manner as shown for the MOSFET in FIG. 3. A conventional bootstrap supply comprising diode 102 and capacitor 104 coupled to the DC bus through resistor 106 is provided for upper IGBT 98.

Figure 10:
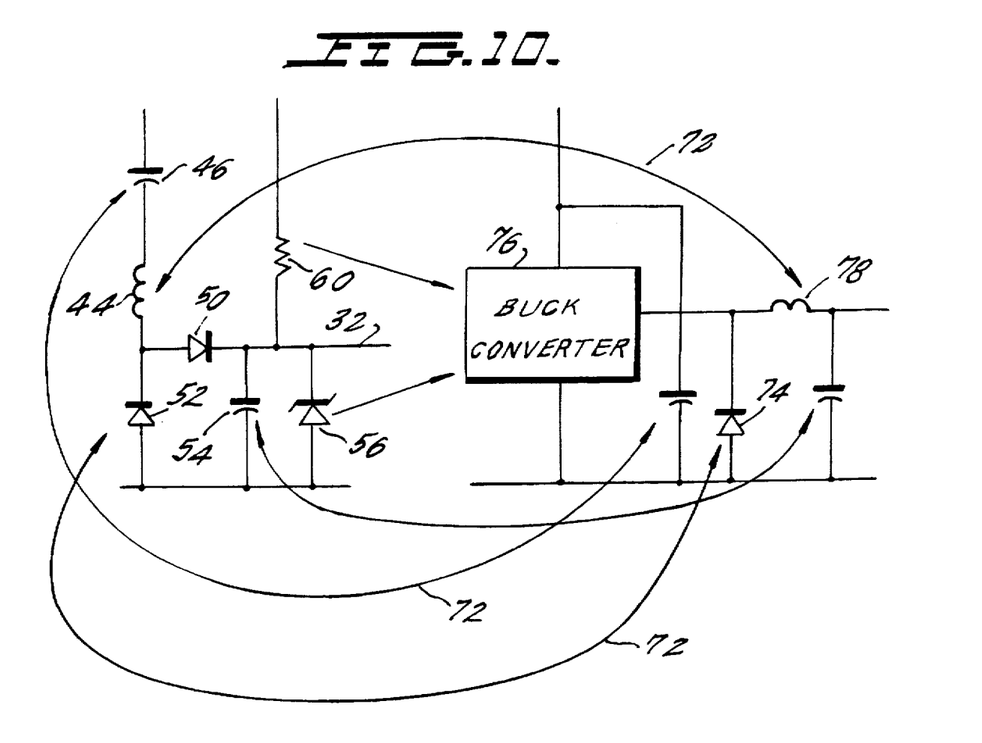
FIG. 10 is a comparison chart comparing the resonant power supply of the present invention to a prior art buck converter auxiliary power supply design.

Referring to FIG. 10, a comparison of the resonating power supply of the present invention (left side of figure) to a conventional buck converter circuit, shows components that are roughly equivalent in terms of cost and size as indicated by cross-connecting arrows 72. Note that the diodes 50 and 52 are exposed only to the output voltage of the auxiliary power supply 30, and need have only low voltage capability, typically 30 volt Schottky diodes being sufficient. The diode 74 of the buck converter, however, needs to be a high voltage (500–600 V) fast recovery device.

FIG. 10 further illustrates that most of the components needed for the resonating power supply of the present invention are equivalent to the peripheral components needed for the buck converter, and the real comparison between the two circuits comes down to the resistor 60 and zener diode 56 which typically can be 1–3 watts for the present invention versus the buck converter 76 itself. On this basis, the buck converter 76 does not compare favorably.

Figure 11:
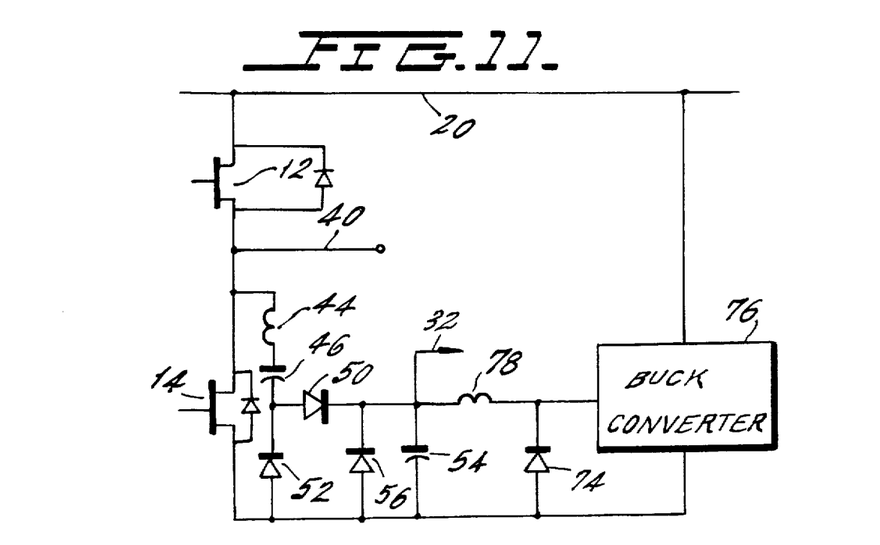
FIG. 11 is a circuit diagram of yet another embodiment of the present invention.

Nonetheless, a buck converter offers an ability to furnish ample bias power prior to start-up and a more tightly regulated output voltage. Accordingly, the present invention conceives that for very high power systems which require significant power prior to starting of the main output switching circuit, and where the running power required is beyond the capability of the buck converter itself, the buck converter can be used as a starter circuit for a higher power resonant circuit. This concept is illustrated in FIG. 11. The inductor 78 in FIG. 11 corresponds to the inductor bearing the same reference numeral in FIG. 10. Thus, the $V_{CC}$ source 32 has been implemented by the buck converter providing start-up, with the resonant power supply of the present invention providing power after start-up during normal operation.

In an embodiment of the auxiliary power supply 30 of the present invention which has been reduced to practice, the specific component values and types were as set forth in the table below.

| Device | Value/Type |
| --- | --- |
| Drive Circuit 10 | IR 2110 |
| Transistors 12, 14 | IRFP450 |
| Inductor 44 | 20 uH |
| Capacitor 46 | 150 pF, 100 pF, 68 pF |
| Diodes 50, 52 | 11DQ03 |
| Zener 56 | 1N5352A |
| Capacitor 54 | 1 uF, 20V |
| Resistor 60 | 2 MΩ, ¼W |
| Load 76 | 1 KΩ |

The auxiliary power supply according to the present invention which has been reduced to practice was tested with several capacitor 46 values, namely 68 pF, 100 pF and 150 pF with and without active pull-down and at a main DC bus voltage of 200 V and 400 V.

A test with capacitor 46 at 68 pF, and a switching frequency of 400–500 kHz provides satisfactory operation over a DC bus voltage range from 250–400 V. With active pull-down, at 400 V and 500 kHz, the power consumption in the zener diode is approximately 1.4 watts for a capacitor 46 of 68 pF, versus 2.8 watts for the same operating conditions with the value of the capacitor 46 at 150 pF.

Although the present invention has been described in relation to particular embodiments thereof, many other variations and modifications and other uses will become apparent to those skilled in the art. Therefore, the present invention should not be limited by the specific disclosure herein, but only by the appended claims.

What is claimed is:

1. A power supply circuit having only passive components for producing a DC output from a pulsed input comprising current flowing on a path through a switching transistor circuit and switched by the switching transistor circuit, and for supplying the DC output as an auxiliary power source for powering drive circuitry driving the switching transistor circuit, the power supply circuit comprising:

a series LC circuit having a first terminal and a second terminal, the first terminal being coupled to the current path and drawing a portion of the current flowing through the switching transistor circuit;

an output capacitor electrically charged through the series LC circuit from the pulsed input and for providing the DC output to the drive circuitry, at least the drive circuitry being contained within a modular housing; and a coupling circuit connected between the second terminal of the LC circuit and the output capacitor for coupling charge from the series LC circuit to the output capacitor, said power supply circuit being included in the modular housing for the drive circuitry, thereby reducing the number of external power supplies necessary for powering said drive circuitry and reducing the number of external terminals of said drive circuitry.

2. The circuit of claim 1, further comprising:

a voltage regulator coupled to the output capacitor to regulate and maintain the DC output at the output capacitor at a substantially constant predetermined value.

3. The circuit of claim 1, wherein the DC output is a low voltage DC output and said pulsed input is a high voltage pulsed input having an amplitude greater than said DC output.

4. The circuit of claim 1, wherein the pulsed input has a frequency of operation substantially lower than a resonance frequency associated with the LC circuit.

5. The circuit of claim 2, wherein the voltage regulator is a zener diode.

6. The circuit of claim 1, wherein the coupling circuit further comprises a diode connected in series between the LC circuit and the output capacitor.

7. The circuit of claim 6, wherein the LC circuit is connected to the anode of the diode and the cathode of the diode is connected to the output capacitor.

8. The circuit of claim 1, further comprising a startup circuit for charging the output capacitor prior to the presence of a pulse on said pulsed input.

9. The circuit of claim 8, wherein the startup circuit comprises a resistor.

10. The circuit of claim 8, wherein the startup circuit comprises a buck converter.

11. The circuit of claim 1, wherein the pulsed input has a voltage magnitude in a range of 20–2000 V.

12. The circuit of claim 11, wherein the pulsed input has a voltage magnitude in a range of 200–400 V.

13. The circuit of claim 3, wherein the low voltage DC output has a voltage range an order of magnitude lower than the voltage of the pulsed input.

14. The circuit of claim 1, further comprising a bypass diode connected in series between one node of the output capacitor and the LC circuit.

15. The circuit of claim 1, wherein the switching transistor circuit comprises first and second, series-connected power transistors the midpoint of the series transistor connection being connected to an output terminal driven by a driver circuit for turning the first and second power transistors on and off, and further comprising a main DC bus for supplying high voltage DC to the transistors, the first and second transistors producing the pulsed input.

16. The circuit of claim 1, wherein the first terminal of the LC circuit is coupled to an output of a power transistor providing the pulsed input.

17. The circuit of claim 1, wherein the LC circuit comprises a resonant inductor and an associated resonant capacitor and the resonant capacitor has a capacitance value of approximately 100 pF.

18. The circuit of claim 2, further comprising a second output capacitor and a second voltage regulator for producing a negative DC output having a polarity opposite to a polarity associated with the DC output.

19. The circuit of claim 1, wherein the DC voltage output is referenced to a ground voltage.

20. The circuit of claim 1, wherein the DC output is referenced to a DC high voltage.

21. The circuit of claim 15, wherein the LC circuit is connected to the main DC bus and the output capacitor is coupled to the pulsed input.

22. The circuit of claim 15, further comprising a bootstrap supply circuit coupled to at least one of said power transistors.

23. The circuit of claim 22, wherein the bootstrap circuit comprises a diode charging a capacitor.

24. The circuit of claim 1, wherein the second terminal of the LC circuit is coupled to a DC bus voltage.

25. A resonant power supply circuit having only passive components for providing a low voltage DC output auxiliary power source for drive circuitry for a switching transistor circuit, the power supply circuit comprising:

a series LC circuit having a first terminal coupled to a high voltage pulsed input comprising current flowing on a path through a switching transistor circuit and switched by the switching transistor circuit and further having a second terminal;

an output capacitor electrically charged through the series LC circuit from the pulsed input and for providing the low voltage DC output to the drive circuitry of the switching transistor circuit, at least the drive circuitry being contained within a modular housing;

a voltage regulator coupled to the output capacitor to regulate and maintain the low voltage DC output at the output capacitor at a substantially constant predetermined value; and a coupling circuit connected between the second terminal of the LC circuit and the output capacitor for coupling charge from the series LC circuit to the output capacitor, said power supply circuit being included in the modular housing for the drive circuitry, thereby reducing the number of external power supplies necessary for powering said drive circuitry and reducing the number of external terminals of said drive circuitry.

26. The resonant power supply of claim 25, wherein the pulsed input has a frequency of operation substantially lower than a resonance frequency associated with the LC circuit.

27. The resonant power supply of claim 25, wherein the voltage regulator is a zener diode.

28. The resonant power supply of claim 25, wherein the coupling circuit further comprises a diode connected in series between the LC circuit and the output capacitor.

29. The resonant power supply of claim 28, wherein the LC circuit is connected to the anode of the diode and the cathode of the diode is connected to the output capacitor.

30. The resonant power supply of claim 25, further comprising a startup circuit for charging the output capacitor prior to the presence of a pulse on said pulsed input.

31. The resonant power supply of claim 30, wherein the startup circuit comprises a resistor.

32. The resonant power supply of claim 30, wherein the startup circuit comprises a buck converter.

33. The resonant power supply of claim 25, wherein the pulsed input has a voltage magnitude in a range of 20–2000 V.

34. The resonant power supply of claim 33, wherein the pulsed input has a voltage magnitude in a range of 200–400 V.

35. The resonant power supply of claim 25, wherein the low voltage DC output has a voltage range an order of magnitude lower than the voltage of the pulsed input.

36. The resonant power supply of claim 25, further comprising a bypass diode connected in series between one node of the output capacitor and the LC circuit.

37. The resonant power supply of claim 25, wherein the switching transistor circuit comprises first and second, series-connected power transistors the midpoint of the series transistor connection being connected to an output terminal driven by a driver circuit for turning the first and second power transistors on and off, and further comprising a main DC bus for supplying high voltage DC output to the transistors, the first and second transistors producing the high voltage pulsed input.

38. The resonant power supply of claim 25, Wherein the LC circuit comprises a resonant inductor and an associated resonant capacitor and the resonant capacitor has a capacitance value of approximately 100 pF.

39. The resonant power supply of claim 25, further comprising a second output capacitor and a second voltage regulator for producing a negative low voltage output having a polarity opposite to a polarity associated with the first voltage output.

40. The resonant power supply of claim 25, wherein the low voltage output is referenced to a ground voltage.

41. The resonant power supply of claim 25, wherein the low voltage output is referenced to a DC high voltage.

42. The resonant power supply of claim 37, wherein the LC circuit is connected to the main DC bus and the output capacitor is coupled to the high voltage pulsed input.

43. The resonant power supply of claim 37, further comprising a bootstrap supply circuit coupled to at least one of said power transistors.

44. The resonant power supply of claim 43, wherein the bootstrap circuit comprises a diode charging a capacitor.

45. The circuit of claim 25, wherein the first terminal of the LC circuit is coupled to the high voltage pulsed input and the second terminal of the LC circuit is coupled to a DC bus voltage.

46. A method for producing a low voltage DC output from a high voltage pulsed input comprising current flowing on a path through a switching transistor circuit and switched by the switching transistor circuit, and for supplying the DC output as an auxiliary power source for drive circuitry for the switching transistor circuit, the method comprising the steps of:

providing portions of the pulsed electrical energy from the pulsed input to a series LC circuit;

electrically charging an output capacitor through the series LC circuit with the portions of the pulsed electrical energy provided from the pulsed input to generate a voltage across the output capacitor; and providing the voltage across the charged output capacitor as an auxiliary power source to power the drive circuitry for the switching transistor circuit, at least the drive circuitry being contained within a modular housing, said power supply circuit being included in the modular housing for the drive circuitry, thereby reducing the number of external power supplies necessary for powering said drive circuitry and reducing the number of external terminals of said drive circuitry.

47. The method recited in claim 46, further comprising the step of:

regulating the voltage across the output capacitor at substantially the low voltage DC output value.

48. The method recited in claim 46, further comprising the step of pulsing said pulsed input at a substantially lower frequency than a resonance frequency associated with the LC circuit.

49. The method recited in claim 46, further comprising the step of providing start up energy for charging the output capacitor prior to providing said pulsed electrical energy.

50. The method recited in claim 46, wherein said step of providing pulsed energy comprises providing pulsed energy having a voltage magnitude in a range of 20–2000 V.

51. The method recited in claim 50, wherein said step of providing pulsed energy comprises providing pulsed energy having a voltage magnitude in a range of 200–400 V.

52. The method recited in claim 46, wherein the low voltage DC output has a voltage range an order of magnitude lower than the high voltage pulsed input.

53. The method recited in claim 46, further comprising the step of providing the low voltage DC output to a low voltage input of a power transistor switching circuit.

* * * * *